United States Patent
Pirkl et al.

(10) Patent No.: US 6,349,705 B1
(45) Date of Patent: Feb. 26, 2002

(54) METHOD OF CHECKING A CAPACITIVE ACTUATOR

(75) Inventors: Richard Pirkl; Achim Przymusinski; Walter Schrod; Mark Elliott, all of Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/521,500

(22) Filed: Mar. 9, 2000

(30) Foreign Application Priority Data

Mar. 9, 1999 (DE) .......................... 199 10 388

(51) Int. Cl.[7] ............................................. F02M 51/00
(52) U.S. Cl. ....................................... 123/490; 123/499
(58) Field of Search ................................ 123/490, 498, 123/446, 472, 478, 499; 310/316, 317, 318

(56) References Cited

U.S. PATENT DOCUMENTS

| | | | | |
|---|---|---|---|---|
| 4,688,536 A | * | 8/1987 | Mitsuyasu et al. | 123/490 |
| 5,053,668 A | * | 10/1991 | Mitsuyasu | 310/317 |
| 5,057,734 A | * | 10/1991 | Tsuzuki et al. | 310/317 |
| 6,147,433 A | * | 11/2000 | Reineke et al. | 310/316.03 |

FOREIGN PATENT DOCUMENTS

| | | |
|---|---|---|
| DE | 196 52 809 C1 | 6/1998 |
| DE | 198 04 196 A1 | 8/1999 |
| GB | 1 540 216 | 2/1979 |

\* cited by examiner

*Primary Examiner*—Henry C. Yuen
(74) *Attorney, Agent, or Firm*—Herbert L. Lerner; Laurence A. Grennberg; Werner H. Stemer

(57) ABSTRACT

A capacitive actuator is driven with a control signal st. The duration ti of actual actuator actuation is compared with the duration $t_{st}$ of the control signal st. Proper operation is determined, and the actuator is assumed to be operating correctly, if the measured duration ti is within a range determined by the duration $t_{st}$ of the control signal.

10 Claims, 2 Drawing Sheets

operating a capacitive actuator with a control signal having a given duration defined by a start and an end; defining a duration of actuator actuation to extend from an instant at which a charging current produced by the start of the control signal is below a predetermined, upper threshold value, up to an instant, at which a discharge current produced by the end of the control signal is above a predetermined, lower threshold value;

METHOD OF CHECKING A CAPACITIVE ACTUATOR

BACKGROUND OF THE INVENTION

FIELD OF THE INVENTION

The invention relates to a method of checking a capacitive actuator, particularly an actuator for a fuel-injection valve in an internal combustion engine, for correct operation and proper functionality.

British patent specification GB 1 540 216 discloses a method of checking piezo-electric actuators in which the deflection of a valve tappet is measured with a coil. The measured value is compared in comparators with a reference value, and correct operation of the actuator is inferred on this basis. If the correct operation cannot be confirmed, a warning signal is output.

Additional information in this context may be gleaned from the German published patent application DE 198 04 196 A1, which is not a prior art publication. There is described a method of checking piezo-electric actuators, particularly for fuel-injection valves, in which the voltage on the actuator is compared with threshold values, and this is used to diagnose correct operation of the actuator.

German patent DE 196 52 809 discloses an assembly for driving a piezo-electric actuator for a fuel-injection valve in an internal combustion engine. Such an actuator can be regarded as a capacitive energy store.

In order to open a fuel-injection valve in an internal combustion engine, it is necessary to apply an electric charge to the actuator. When the charge is removed from the actuator, the injection valve is closed. The injected fuel quantity is primarily dependent, for a constant fuel pressure, for example in a common rail fuel-injection system, on the injection duration.

When any capacitive actuator is charged, a charging current flows into the actuator; the latter is charged when the charging current becomes zero. During the charging process, the actuator voltage across the actuator rises to a particular value. In the charged state, no current flows, and the actuator voltage remains approximately constant. During discharge, a discharge current flows out of the actuator. The latter is discharged when the discharge current returns to zero. During the discharging process, the actuator voltage drop across the actuator falls to zero volts.

These processes can be disrupted by internal or external disruptive influences such that the charge applied to the actuator remains on the actuator longer than stipulated by the control signals output by an engine control system, and the fuel-injection valve remains open for an undefined duration, which results in too much fuel being injected.

SUMMARY OF THE INVENTION

It is accordingly an object of the invention to provide a method of checking a capacitive actuator for proper operation, which overcomes the above-mentioned disadvantages of the heretofore-known devices and methods of this general type and which provides for a method of driving the capacitive actuator and allows a simple way of monitoring actuator actuation independently of the drive signal.

With the foregoing and other objects in view there is provided, in accordance with the invention, a method of checking a capacitive actuator, in particular a fuel injection valve in an internal combustion engine, for correct operation. The method comprises the following steps:

operating a capacitive actuator with a control signal having a given duration defined by a start and an end; defining a duration of actuator actuation to extend from an instant at which a charging current produced by the start of the control signal is below a predetermined, upper threshold value, up to an instant, at which a discharge current produced by the end of the control signal is above a predetermined, lower threshold value;

measuring the duration of actuator actuation and comparing the duration with the given duration of the control signal; and determining that the actuator is operating correctly if the measured duration deviates from the duration of the control signal only within an acceptable range.

In accordance with an alternative embodiment of the inventive concept there is provided method of checking a capacitive actuator for correct operation, which comprises:

operating a capacitive actuator with a control signal having a given duration from a start to an end;

defining a duration of actuator actuation to extend from an instant at which an actuator voltage, rising after the start of the control signal, lies above a predetermined threshold value, up to an instant at which the actuator voltage, falling after the end of the control signal, lies below the threshold value;

measuring the duration of actuator actuation and comparing the measured duration with the given duration of the control signal; and determining that the actuator is operating correctly if the measured duration deviates from the duration of the control signal only within an acceptable range.

In other words, the current $\pm Ip$ supplied to the actuator and dissipated by it or the voltage Up applied to the actuator is measured and, by comparison with threshold values, the actuation duration of the actuator (which is identical to the fuel-injection duration in the internal combustion engine context) is determined. This actuation duration ti is then compared with the duration $t_{st}$ of the control signal st output by an engine control unit. If the two signals ti and $t_{st}$ are the same within predetermined limits, fuel injection is assumed to be operating correctly. Faults can be recognized quickly.

In a preferred implementation, the acceptable range is defined as $[t_{st}-x]<ti<[t_{st}+x]$, where $t_{st}$ is the duration of the control signal, ti is the measured duration of actuator actuation, and x is a predefined time period (e.g., 3% of $t_{st}$).

In accordance with an additional feature of the invention, an optical error display and/or an entry in an error memory of a diagnostic circuit for the actuator is produced if $ti<[t_{st}-x]$ or if $ti>[t_{st}+x]$.

In accordance with a concomitant feature of the invention, the actuator is turned off if $ti<[t_{st}-x]$ or if $ti>[t_{st}+x]$.

Other features which are considered as characteristic for the invention are set forth in the appended claims.

Although the invention is illustrated and described herein as embodied in a method of checking a capacitive actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED OF THE PREFERRED EMBODIMENTS

Figure 1:
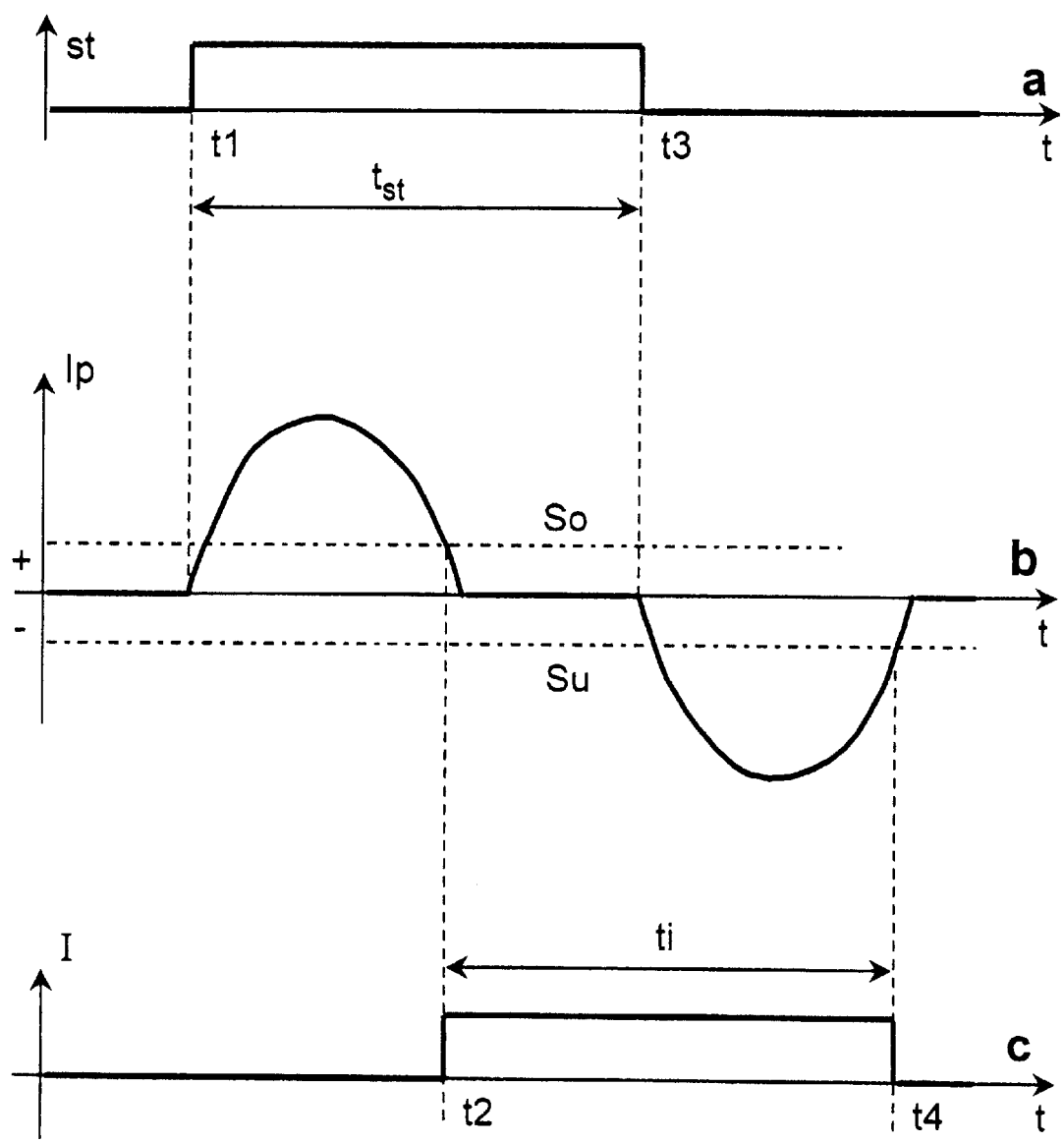
FIG. 1 is a timing chart showing a first exemplary embodiment in accordance with the invention.

Referring now to the figures of the drawing in detail and first, particularly, to FIG. 1 thereof, there is shown a first exemplary embodiment of the invention. By way of example, the invention is explained for a capacitive actuator for a fuel-injection valve in an internal combustion engine. Three signal or measured-value curves are shown for actuator actuation, i.e. for a fuel-injection process, over time t. Timing line 1a shows the curve (start and duration) for the control signal st for the actuator for the fuel-injection valve during an injection process. The control signal is determined by an engine control unit as the result of a plurality of input parameters, such as engine speed, load, temperature, etc.

The control signal st starts at an instant t1 and ends at an instant t3. The difference t3−t1 is equivalent to the duration $t_{st}$ of this control signal st. For the sake of simplicity, times and instants are shown in the signal or measured-value curve graphs; instants for the start or end of control signals from the engine control unit are usually given in crankshaft angles (KW), however.

From the instant t1, the actuator is charged with a charging current +Ip. After the end of the control signal st, it is discharged with a discharge current −Ip from the instant t3.

The curve for the charging and discharge current with respect to time is shown in time line 1b. The fuel-injection duration for the fuel-injection valve driven by the actuator starts approximately at the instant at which the (positive) charging current becomes zero, and ends approximately at the instant at which the (negative, i.e. flowing in the opposite direction) discharge current likewise becomes zero.

If the charging current +Ip is now compared with an upper threshold value So, and the discharge current −Ip is compared with a lower threshold value Su, as shown in FIG. 1b, then, with an appropriate choice—possibly determined in experiments—of threshold values So and Su, the duration ti between the instant t2, at which the charging current +Ip is below the upper threshold value, and the instant t4, at which the discharge current −Ip is below the lower threshold value Su, is equivalent both to the duration $t_{st}$ of the control signal st and to the fuel-injection duration.

If the duration ti does not differ too much from the duration $t_{st}$, i.e. if $(t_{st}-x)<ti<(t_{st}+x)$, for example $x=0.03*t_{st}$, then it is assumed that the fuel-injection system is operating correctly. Otherwise, measures can be taken ranging from an optical error display or an entry in an error memory of a diagnostic system up to switching off the internal combustion engine.

Figure 2:
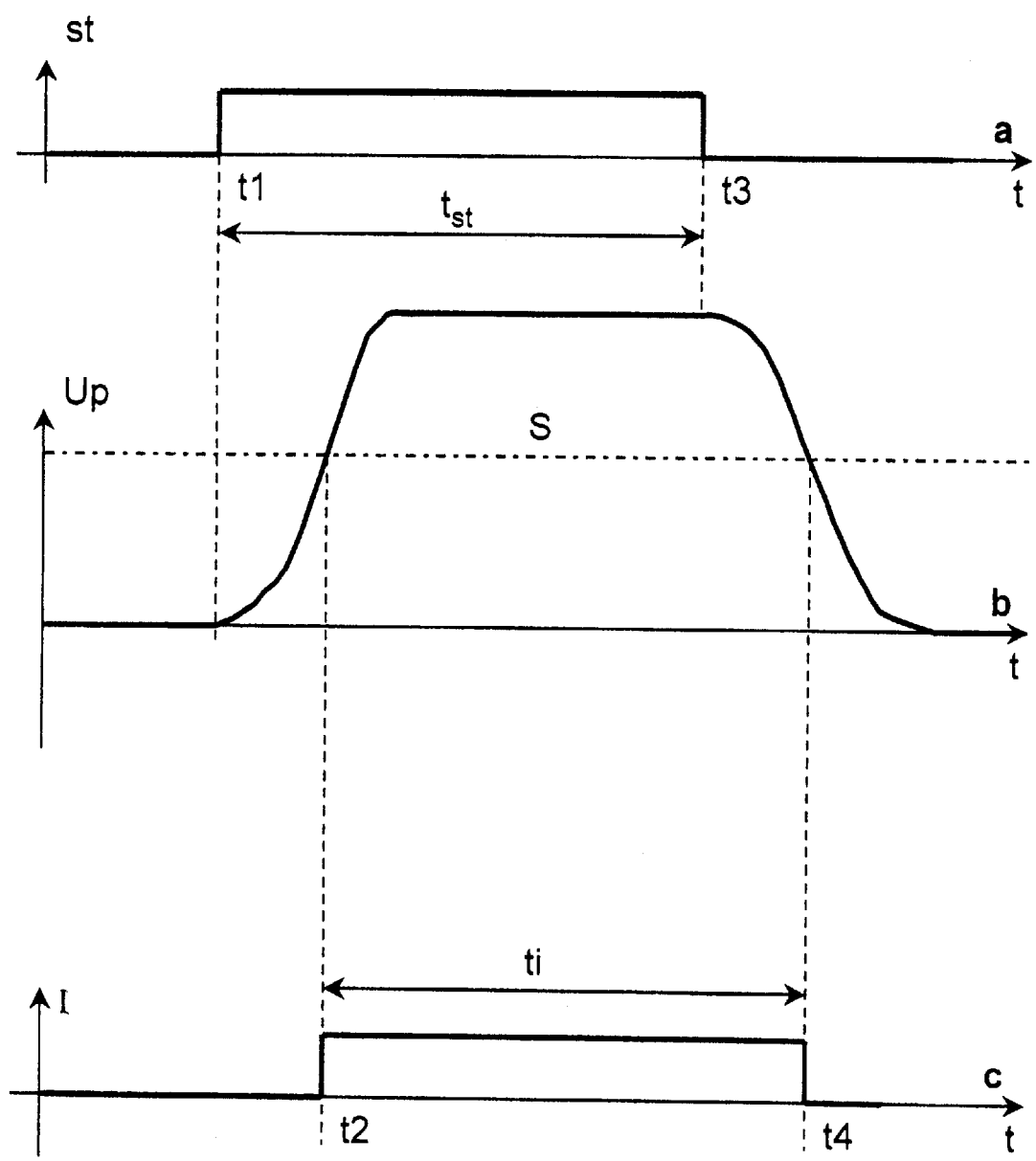
FIG. 2 is a timing chart showing a second exemplary embodiment.

In a second exemplary embodiment, FIG. 2 likewise shows three signal or measured-value curves for a fuel-injection process over time t. In this illustrative embodiment according to the invention, however, it is not the charging or discharge current ±Ip that is compared with threshold values, but rather the voltage Up present on the actuator.

Due to the fact that, in the second exemplary embodiment, only one threshold value is necessary, the second alternative may be considered the preferred method according to the invention.

The time line 2a again shows the curve (start t1 and duration $t_{st}$) for the control signal st for the actuator for a fuel-injection valve during an injection process.

The time line 2b shows the curve for the voltage Up present on the actuator during an injection process. This voltage starts to rise at the instant t1, at the start of the control signal st, and subsequently reaches its maximum value, which is maintained until the end of the control signal st. At the end of the control signal st, at the instant t3, the voltage Up begins to fall until it returns to zero (see line 1b).

If the voltage Up present on the actuator is compared with a threshold value S, then the duration ti, with an appropriate choice—possibly determined in experiments—of threshold value S, from the instant t2 to the instant t4, during which the voltage Up rises above this threshold value S, Up>S, as in the illustrative embodiment shown in FIG. 1, is equivalent to the duration ($t_{st}$) of the control signal st and to the fuel-injection duration.

If, as in the first embodiment, the duration ti does not differ too much from the duration $t_{st}$, $(t_{st}-x)<ti<(t_{st}+x)$, for example $x=0.03*t_{st}$, then, in this case too, it is assumed that the fuel-injection system is operating correctly. Otherwise, the measures described for the first illustrative embodiment can be taken in this case too.

We claim:

1. A method of checking a capacitive actuator for correct operation, which comprises:

operating a capacitive actuator with a control signal having a given duration from a start to an end;

defining a duration of actuator actuation to extend from an instant at which a charging current produced by the start of the control signal is below a predetermined upper threshold value, up to an instant, at which a discharge current produced by the end of the control signal is above a predetermined lower threshold value;

measuring the duration of actuator actuation and comparing the duration with the given duration of the control signal; and determining that the actuator is operating correctly if the measured duration deviates from the duration of the control signal only within an acceptable range.

2. The method according to claim 1, wherein the acceptable range is defined as $[t_{st}-x]<ti<[t_{st}+x]$, where $t_{st}$ is the duration of the control signal, ti is the measured duration of actuator actuation, and x is a predefined time period.

3. The method according to claim 2, which comprises producing at least one of an optical error display and an entry in an error memory of a diagnostic circuit for the actuator if $ti<[t_{st}-x]$ or if $ti>[t_{st}+x]$.

4. The method according to claim 2, which comprises turning the actuator off if $ti<[t_{st}-x]$ or if $ti>[t_{st}+x]$.

5. The method according to claim 1, wherein the operating step comprises actuating a fuel injection valve in an internal combustion engine.

6. A method of checking a capacitive actuator for correct operation, which comprises:

operating a capacitive actuator with a control signal having a given duration from a start to an end;

defining a duration of actuator actuation to extend from an instant at which an actuator voltage, rising after the start of the control signal, lies above a predetermined threshold value, up to an instant at which the actuator voltage, falling after the end of the control signal, lies below the threshold value;

measuring the duration of actuator actuation and comparing the measured duration with the given duration of the control signal; and determining that the actuator is operating correctly if the measured duration deviates from the duration of the control signal only within an acceptable range.

7. The method according to claim 6, wherein the acceptable range is defined as $[t_{st}-x]<ti<[t_{st}+x]$, where $t_{st}$ is the duration of the control signal, ti is the measured duration of actuator actuation, and x is a predefined time period.

8. The method according to claim 7, which comprises producing at least one of an optical error display and an entry in an error memory of a diagnostic circuit for the actuator if $ti<[t_{st}-x]$ or if $ti>[t_{st}+x]$.

9. The method according to claim 7, which comprises turning the actuator off if $ti<[t_{st}-x]$ or if $ti>[t_{st}+x]$.

10. The method according to claim 6, wherein the operating step comprises actuating a fuel injection valve in an internal combustion engine.

* * * * *